United States Patent
Dawson et al.

(10) Patent No.: US 8,251,784 B2
(45) Date of Patent: Aug. 28, 2012

(54) SYSTEM AND METHOD TO ROUTE AIRFLOW THROUGH DYNAMICALLY CHANGING DUCTS

(75) Inventors: Christopher J. Dawson, Arlington, VA (US); Vincenzo V. Diluoffo, Sandy Hook, CT (US); Rick A. Hamilton, II, Charlottesville, VA (US); Michael D. Kendzierski, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 656 days.

(21) Appl. No.: 12/135,238

(22) Filed: Jun. 9, 2008

(65) Prior Publication Data

US 2009/0305625 A1    Dec. 10, 2009

(51) Int. Cl.
*F24F 7/04* (2006.01)
*H05K 5/00* (2006.01)

(52) U.S. Cl. ............ 454/184; 49/234; 49/256; 49/195; 49/160; 49/202; 49/136; 49/198; 49/506; 62/263; 62/265; 62/259.2; 160/49; 160/137; 361/695

(58) Field of Classification Search .......... 454/184; 49/234, 256, 195, 160, 202, 136, 198, 506; 62/263, 265, 259.2; 160/49, 137; 361/695, 361/694
See application file for complete search history.

(56) References Cited

U.S. PATENT DOCUMENTS

| | | | |
|---|---|---|---|
| 2,751,198 A | 6/1956 | Rapp | |
| 2,967,678 A * | 1/1961 | Briggs | ......................... 244/53 B |
| 3,516,347 A | 6/1970 | May | |
| 3,690,243 A | 9/1972 | Lambert | |
| 3,757,666 A | 9/1973 | Lambert | |
| 3,835,606 A | 9/1974 | Liberman | |
| 3,915,377 A * | 10/1975 | Sutton, Jr. | ..................... 454/239 |
| 3,986,850 A | 10/1976 | Wilcox | |
| 4,164,211 A * | 8/1979 | Onnen | ..................... 126/285 A |
| 4,493,311 A * | 1/1985 | Bachmann | ............... 126/285 A |
| 4,646,500 A | 3/1987 | Smith | |
| 4,783,943 A | 11/1988 | Ljungkvist | |
| 4,996,810 A | 3/1991 | Forde | |

(Continued)

FOREIGN PATENT DOCUMENTS

JP          01273931 A  * 11/1989

(Continued)

OTHER PUBLICATIONS

Siemens Building Technologies Helping Your Building Work for You, Feb. 2, 2007, http://web.archive.org/web/20070202194530/http://www.us.sbt.siemens.com/marketplaces/advantageservices.asp.*

(Continued)

*Primary Examiner* — Steven B McAllister
*Assistant Examiner* — Phillip E Decker
(74) *Attorney, Agent, or Firm* — John Pivnichny; Roberts Mlotkowski Safran & Cole, P.C.

(57) ABSTRACT

The invention generally relates to ventilation systems and methods, and more particularly to selectively configurable climate control systems and methods for use in data centers and the like. A system includes a first structural element and a second structural element spaced apart from first structural element to define a space between the first and second structural elements. The system also includes a plurality of partitions moveable into the space between the first and second structural elements and a controller arranged to control movement of the plurality of partitions.

11 Claims, 8 Drawing Sheets

U.S. PATENT DOCUMENTS

| | | | |
|---|---|---|---|
| 5,107,687 A | | 4/1992 | Candeloro |
| 5,167,575 A | | 12/1992 | MacDonald |
| 5,240,470 A | * | 8/1993 | Wright ............................. 95/58 |
| 5,263,289 A | | 11/1993 | Boyd |
| 5,467,607 A | | 11/1995 | Harvey |
| 5,815,987 A | * | 10/1998 | Beasley ............................ 52/65 |
| 5,992,108 A | | 11/1999 | Falcey |
| 6,033,301 A | | 3/2000 | Suwa |
| 6,099,406 A | * | 8/2000 | Demster ...................... 454/236 |
| 6,415,851 B1 | * | 7/2002 | Hall et al. .................... 454/144 |
| 6,557,357 B2 | * | 5/2003 | Spinazzola et al. ............... 62/89 |
| 6,557,624 B1 | | 5/2003 | Stahl et al. |
| 6,604,993 B1 | | 8/2003 | Boniface |
| 6,675,538 B2 | * | 1/2004 | Candio ............................ 52/65 |
| 6,710,240 B1 | * | 3/2004 | Chen et al. .................... 454/184 |
| 6,745,579 B2 | * | 6/2004 | Spinazzola et al. ............... 62/89 |
| 6,837,184 B2 | * | 1/2005 | Gondhalekar et al. ........ 119/421 |
| 6,862,179 B2 | | 3/2005 | Beitelmal et al. |
| 6,885,115 B2 | | 4/2005 | Hatori et al. |
| 6,981,915 B2 | * | 1/2006 | Moore et al. .................. 454/184 |
| 6,991,533 B2 | | 1/2006 | Tsai et al. |
| 7,075,788 B2 | * | 7/2006 | Larson et al. ................. 361/695 |
| 7,079,387 B2 | * | 7/2006 | Brooks et al. ................. 454/184 |
| 7,170,745 B2 | * | 1/2007 | Bash et al. .................... 454/184 |
| 7,203,062 B2 | * | 4/2007 | Tsuji .............................. 361/695 |
| 7,214,131 B2 | | 5/2007 | Malone |
| 7,259,963 B2 | | 8/2007 | Germagian et al. |
| 7,266,964 B2 | | 9/2007 | Vogel et al. |
| 7,304,477 B2 | | 12/2007 | Konijn et al. |
| 7,365,973 B2 | * | 4/2008 | Rasmussen et al. .......... 454/184 |
| 7,477,514 B2 | * | 1/2009 | Campbell et al. ............. 454/184 |
| 7,595,986 B2 | * | 9/2009 | Glover et al. ................. 361/694 |
| 7,656,660 B2 | * | 2/2010 | Hoeft et al. .................... 454/184 |
| 7,660,121 B2 | * | 2/2010 | Campbell et al. ............. 361/698 |
| 7,716,939 B1 | * | 5/2010 | Morales ........................ 62/259.2 |
| 2002/0117296 A1 | * | 8/2002 | Smith et al. .................... 165/202 |
| 2003/0150231 A1 | * | 8/2003 | Spinazzola et al. .......... 62/259.2 |
| 2003/0209023 A1 | * | 11/2003 | Spinazzola et al. .......... 62/259.2 |
| 2003/0224717 A1 | | 12/2003 | Tsai et al. |
| 2004/0218355 A1 | * | 11/2004 | Bash et al. .................... 454/184 |
| 2005/0159099 A1 | | 7/2005 | Malone |
| 2006/0015712 A1 | | 1/2006 | Ang et al. |
| 2006/0015866 A1 | | 1/2006 | Ang et al. |
| 2006/0029218 A1 | * | 2/2006 | Lu et al. ................... 379/433.13 |
| 2006/0073783 A1 | | 4/2006 | Tsai et al. |
| 2006/0076425 A1 | | 4/2006 | Demster |
| 2006/0260338 A1 | | 11/2006 | VanGilder et al. |
| 2007/0062685 A1 | | 3/2007 | Patel et al. |
| 2007/0080689 A1 | | 4/2007 | Konijn et al. |
| 2007/0146994 A1 | | 6/2007 | Germagian et al. |
| 2007/0213000 A1 | | 9/2007 | Day |
| 2007/0238408 A1 | * | 10/2007 | Taylor ........................... 454/186 |
| 2008/0160898 A1 | * | 7/2008 | Pfannenberg ................. 454/184 |
| 2009/0129016 A1 | * | 5/2009 | Hoeft et al. ..................... 361/694 |
| 2009/0213035 A1 | * | 8/2009 | Edwards et al. ................ 345/1.3 |
| 2009/0302124 A1 | * | 12/2009 | Dawson et al. ............... 454/184 |
| 2010/0108272 A1 | * | 5/2010 | Karidis .......................... 160/238 |
| 2010/0319258 A1 | * | 12/2010 | Betker ............................. 49/199 |
| 2011/0108207 A1 | * | 5/2011 | Mainers et al. ................. 160/87 |

FOREIGN PATENT DOCUMENTS

JP           06207730 A  *  7/1994

OTHER PUBLICATIONS

Hilton Square Port Knife Gate Valves website, Feb. 6, 2005, http://web.archive.org/web/20050206163746/http://hiltonvalve.com/h200_square.htm.*

Siemens Building Technologies Helping Your Building Work for You website, Feb. 2, 2007, http://web.archive.org/web/20070202194530/http://www.us.sbt.siemens.com/marketplaces/advantageservices.asp.*

MDC Vacuum website, Jun. 3, 2007, http://web.archive.org/web/20070603115408/http://www.mdcvacuum.com/.* http://www.tateaccessfloors.com/documentation_green.htm; pp. 1-2.

Alex Frangos; "Raised-Floor Ventilation Gains Footing in Offices"; URL: http://www.realestatejournal.com/propertyreport/office/20030714-frangos.html; pp. 1-2.

Kevin Epstein, et al.; "Double Jeopardy in a 'Slow' Disaster Computing Data Center Challenges in a Pandemic World"; URL: http://www.scalent.com/html/company/News/drj_spring07.pdf?item=21900; Spring 2006; pp. 50-51.

Ron Anderson; Increased power and cooling requirements are creating intensified demand for data-center redesigns; URL: http://i.cmpnet.com/v3.businessinnovation.cmp.com/pdfs/nwca_datacenter_report.pdf ; Aug. 2006; pp. 1-24.

"Data Center Cooling, Server Room Cooling & Rack Cooling Solutions"; URL: http://www.42u.com/42u-rack-cooling.htm; pp. 1-4.

"Flow Modeling Solutions for Data Centers"; URL: http://www.fluent.com/solutions/data_centers/index.htm; p. 1.

* cited by examiner

SYSTEM AND METHOD TO ROUTE AIRFLOW THROUGH DYNAMICALLY CHANGING DUCTS

FIELD OF THE INVENTION

The invention generally relates to ventilation systems and methods, and more particularly to selectively configurable climate control systems and methods for use in data centers and the like.

BACKGROUND

A data center (or other physical space) beneficially has, where possible, an optimized heating and cooling infrastructure. Maintaining data centers at desired temperatures (e.g., set points) helps prevent computer hardware (e.g., IT infrastructure) from overheating and malfunctioning. To this end, many data centers are cooled to relatively low temperatures (e.g., 65° F.) to increase equipment reliability and useful life, and to avoid downtime for repair and/or replacement.

However, current climate control systems are largely inefficient. Data centers typically have hot spots where IT equipment operates. Conventional cooling systems cool the entire data center to a temperature well below the set point so that IT equipment operating in the hot spots does not exceed the set point. This increases operational costs and wastes energy.

More specifically, conventional climate control systems for data centers typically utilize static (i.e., fixed) ducts and vents/diffusers. Usually this is achieved through the use of multiple air conditioners, heaters, vents or blowers. In the current art, a centralized air conditioning or 'forced air' system requires the use of static conduits or ducts. These ducts are usually installed to blow hot or cold air from a centralized air conditioning or heating unit to specific areas of the building. One problem with this known solution is that these ducts cannot easily be changed or rerouted to accommodate changing conditions on a room. For example, ducts are usually embedded in the ceiling, walls, or floor, and therefore require time-consuming intervention to re-route.

Another problem with fixed systems is that they are highly inefficient. In data centers, the hot spots are routinely changing location depending on which IT equipment is running at any given time. For example, some IT infrastructure in a first area of the data center may run during the day, while other IT infrastructure at a different area of the datacenter operates at night. To accommodate such moving hot spot targets, existing systems resort to a sort of 'overkill' by cooling the entire volume of the data center to well below the set point, which increases operational costs. Moreover, with the increasing awareness and desire to operate in a green manner, such excessive use of energy is undesirable.

Distributed cooling systems represent an alternative or supplement to fixed-duct systems, in which individual local units (similar, for example, to a window air conditioning unit) are moved around within the data center depending on the localized cooling needs. However, these decentralized systems are expensive to manage and maintain. Moreover, there is a certain amount of time required to re-position local cooling units within a data center, such that decentralized systems cannot adapt quickly to changes in temperature of different areas in a room.

Accordingly, there exists a need in the art to overcome the deficiencies and limitations described hereinabove.

SUMMARY

In a first aspect of the invention, there is a system for dynamically routing airflow. The system includes a first structural element and a second structural element disposed near the first structural element to define a space between the first and second structural elements. The system also includes a plurality of partitions moveable into the space between the first and second structural elements and a controller arranged to control movement of the plurality of partitions.

In another aspect of the invention, there is a dynamic duct system. The system includes a plurality of partitions selectively extendable in a space between first and second structural members to create airflow diversions between the first and second structural members. The system also includes a controller that controls movement of the plurality of partitions to create ducts between the first and second structural members.

In another aspect of the invention, there is a method comprising actuating a first subset of a plurality of partitions to extended positions between first and second structural members to create a first duct between the first and second structural members. The method also includes actuating a second subset of the plurality of partitions to extended positions between the first and second structural members to create a second duct between the first and second structural members.

In another aspect of the invention, there is a computing infrastructure comprising a controller that is structured and arranged to actuate a first subset of a plurality of partitions to extended positions between first and second structural members to create a first duct between the first and second structural members. The controller is further structured and arranged to actuate a second subset of the plurality of partitions to extended positions between the first and second structural members to create a second duct between the first and second structural members.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to ventilation systems and methods, and more particularly to selectively configurable climate control systems and methods for use in data centers and the like. Embodiments of the invention comprise a dynamic duct system including partitions that are selectively extendable between two structural elements to create a duct between the structural elements. By selectively controlling actuators to extend or retract selected ones of the partitions in a coordinated manner (e.g., via computer control), a targeted air delivery system may be provided. In this manner, implementations of the invention provide a highly efficient climate control system that is reconfigurable both quickly and inexpensively. Accordingly, embodiments of the invention may be used to implement a green data center that is economical to operate and reduces energy waste, while still maintaining computing infrastructure at desired operating temperatures.

Figure 1:
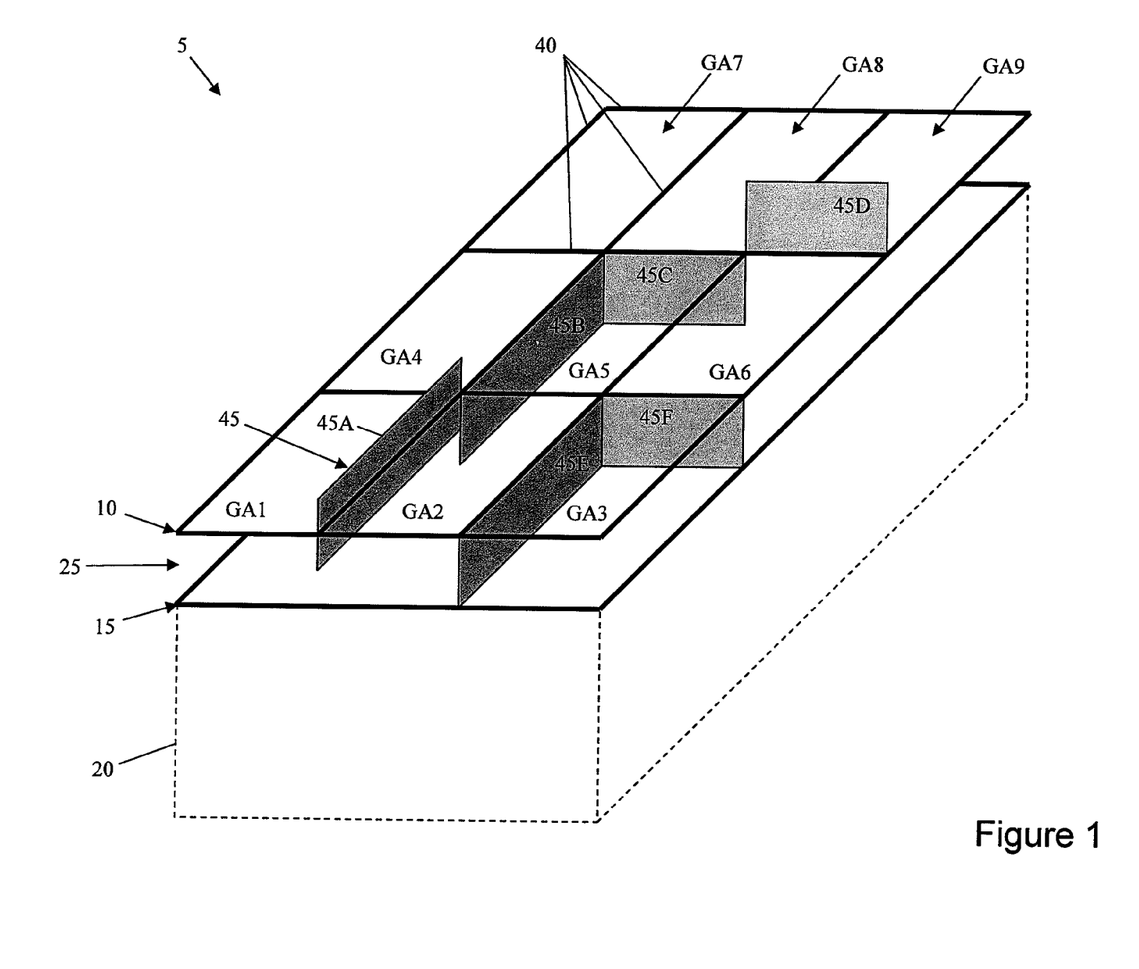
FIGS. 1 and 2 show a perspective views of an exemplary system according to aspects of the invention.

FIG. 1 shows a perspective view of an exemplary dynamic duct system according to aspects of the invention. The system 5 includes a first structural element 10 and a second structural element 15. In embodiments, the first and second structural elements 10, 15 are substantially planar, although the invention is not limited to this configuration, and any suitable shapes can be used within the scope of the invention. The first and second structural elements 10, 15 may be composed of any suitable material (e.g., ceiling tiles, plasterboard, fiberglass, plywood, metal, plastic, compressed fiberboard, etc.).

In embodiments, the system 5 is arranged adjacent or near a room 20, which may comprise, for example, a data center, or any other type of area for which ventilation may be provided. In the embodiment depicted in FIG. 1, the system 5 is arranged above the room 20, such that the second structural element 15 constitutes a ceiling of the room 20. However, the invention is not limited to this configuration, and portions of the system can be arranged in any suitable spatial relation to the room 20, such as, for example, at the floor, at a wall, or at various combinations of at least one of the ceiling, floor, and walls.

The first and second structural elements 10, 15 are spaced apart from one another such that a space 25 is formed between them. The space 25 constitutes a volume in which dynamic ducting according to aspects of the invention may be arranged and re-arranged according to ventilation requirements of the room 20.

In embodiments, the first structural element 10 is divided into a grid as depicted in FIG. 1. In the exemplary embodiment shown in FIG. 1, the grid is a three-by-three grid having nine grid areas labeled GA1, GA2, ..., GA9. The invention is not limited to this size grid, and any suitable grid can be defined in the first structural element 10. In embodiments, each grid area (e.g., GA7) has four rectilinear sides 40 defining its perimeter. Associated with each one of the sides 40 of each grid area GA1, GA2, ..., GA9 is an extendable and retractable partition generally referred to with reference number 45. For clarity, only six partitions, specifically referred to with reference numbers 45A, 45B, ..., 45F, are shown in FIG. 1 and described herein. However, the description of these representative six partitions 45A, 45B, ..., 45F applies to all of the partitions 45 of the system 5. Adjacent grid areas (e.g., GA1 and GA2) may share a common partition (e.g., 45A) along common side 40, such that in the exemplary embodiment shown in FIG. 1, there are a total of twenty four partitions 45 (although only six partitions 45A, 45B, ..., 45F are shown for clarity).

Each partition is selectively moveable between an extended position and a retracted position. In the extended position, the partition 45 extends into the space 25 between the first and second structural elements 10, 15, for example, as depicted by partitions 45B, 45C, 45E, and 45F in FIG. 1. In the retracted position, the partition 45 is arranged so that it does not extend between the first and second structural elements 10, 15, for example, as depicted by partition 45D in FIG. 1. In the specific example shown in FIG. 1, the partitions 45 move between the extended and retracted positions by translating vertically (e.g., perpendicular to the plane of first structural element 10). For example, partition 45A is shown between the extended and retracted positions. However, the invention is not limited to this configuration, and other movement arrangements and retracted positions are useable, as described in greater detail below.

Figure 2:
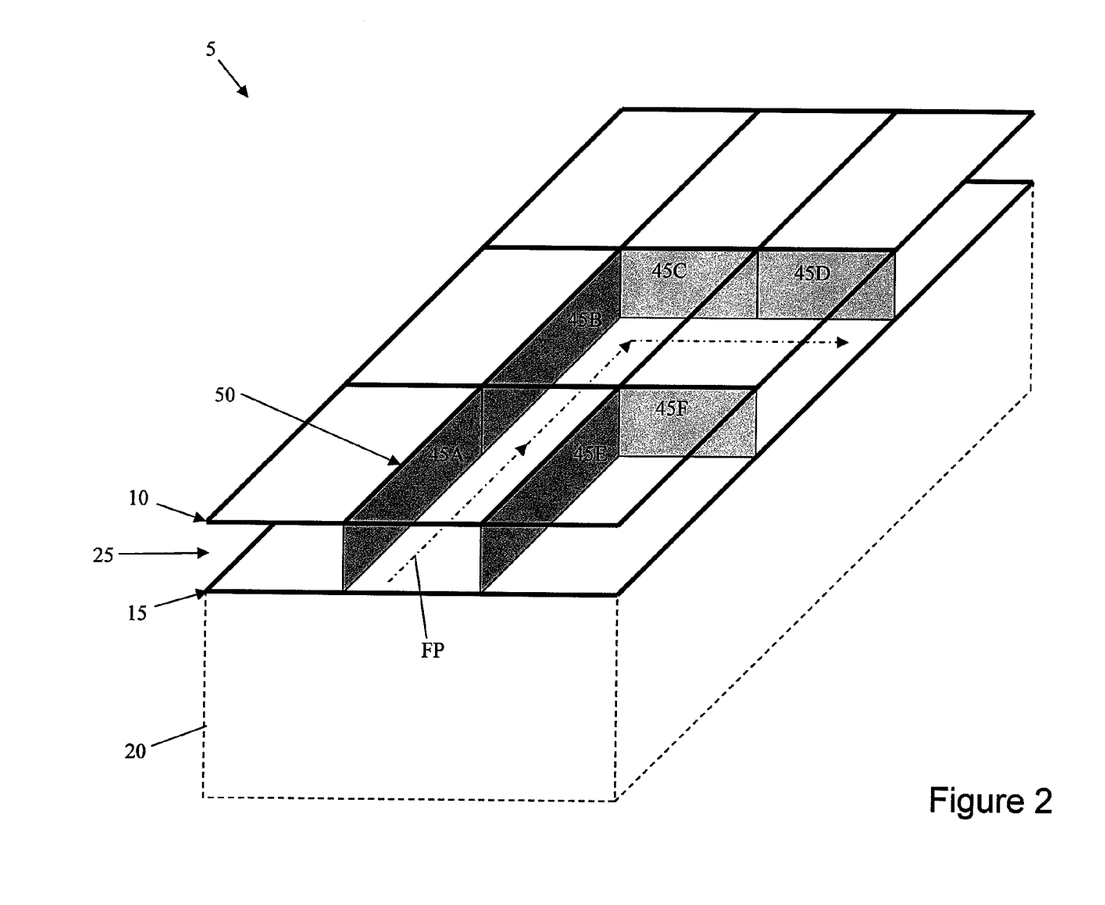

According to aspects of the invention, by selectively controlling which partitions 45 are in the extended and retracted positions, a duct 50 can be dynamically created in the space 25, as depicted in FIG. 2. More specifically, by arranging partitions 45A-F in the extended position (e.g., extending between the first and second structural elements 10, 15), a duct 50 that defines a flow path FP can be provided. Although the first and second structural elements 10, 15 are shown as transparent, they are substantially solid members such that the combination of the first and second structural elements 10, 15 and the extended partitions 45A-F creates a rectangular duct 50 around flowpath FP. A different duct can be arranged in the space 25 by moving partitions 45A-F into the retracted position and moving other partitions into the extended position.

Figure 3:
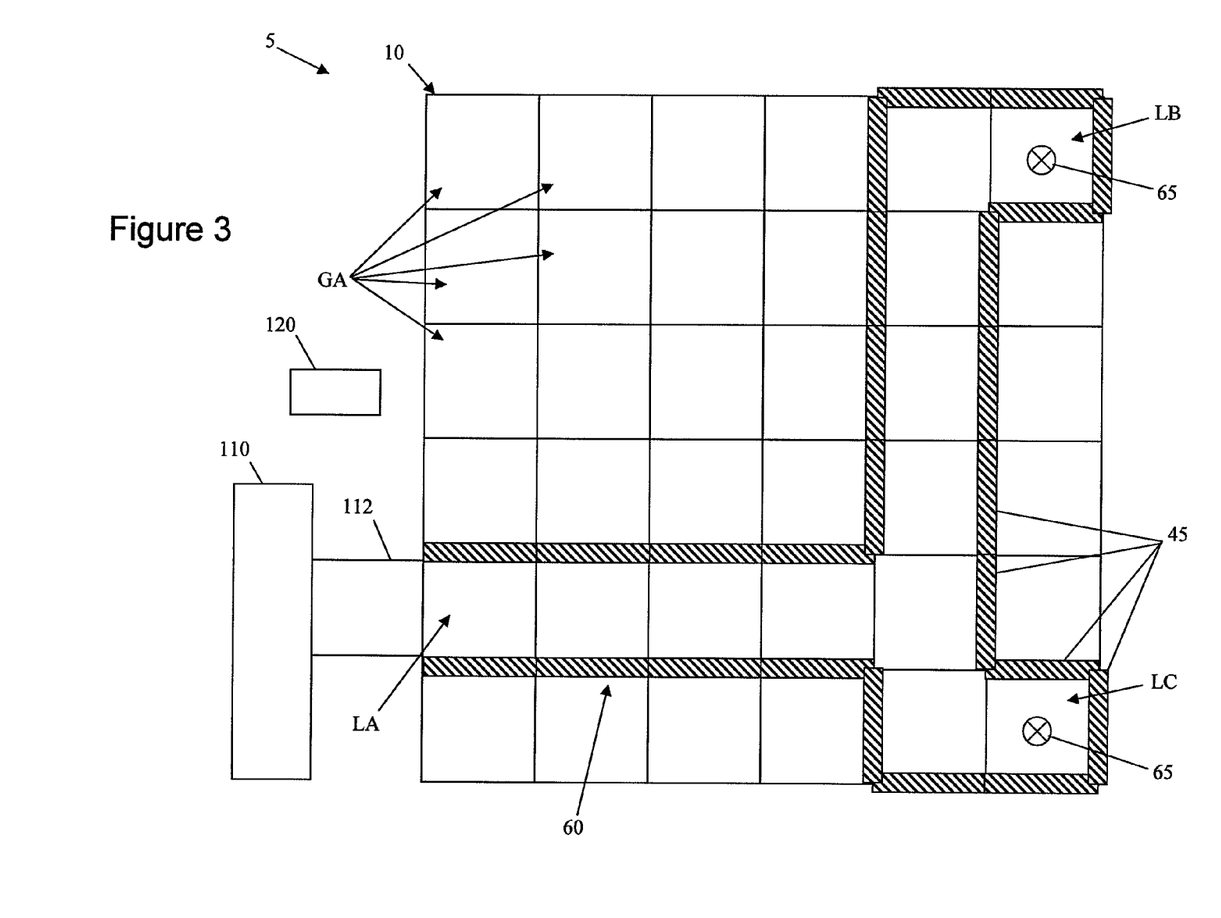
FIGS. 3 and 4 show modes of operation of a system according to aspects of the invention.
Figure 4:
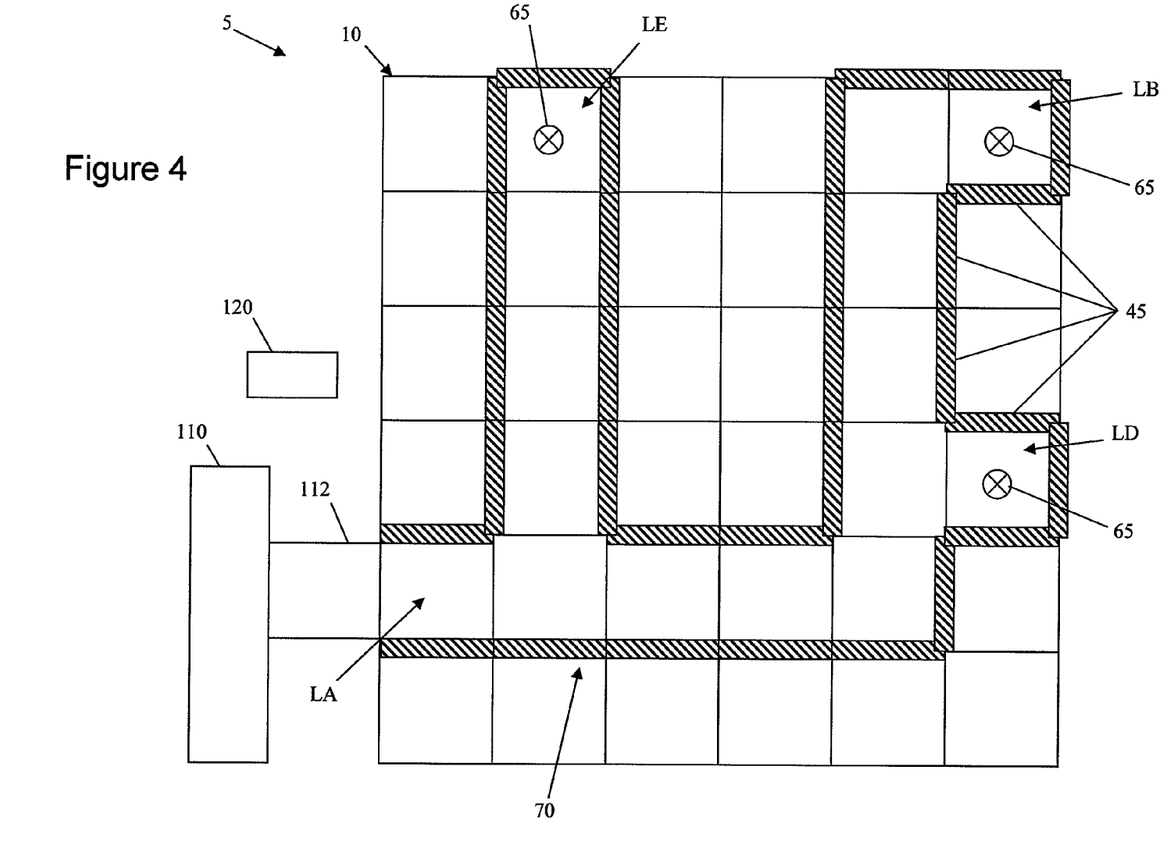

FIGS. 3 and 4 show top down views of exemplary modes of operation of the invention, in which the dynamically changeable ducting of the inventive system is demonstrated. In FIGS. 3 and 4, the upper element 10 is divided into thirty six grid areas, referred to generally as GA. Partitions 45 in the extended position are depicted by cross-hatched areas; all other partitions are in the retracted position. Accordingly, FIG. 3 shows a first duct 60 connecting locations LA, LB, an LC. In the exemplary embodiment shown in FIG. 3, a fluid source 110 (e.g., HVAC unit, blower, exhaust, etc.) may be fluidly connected to location LA by, for example, static ducting 112. In this manner, fluid (e.g., cool air) can be moved from location LA to locations LB and LC via first duct 60.

Moreover, vents 65 may be provided in second structural element 15 to move the fluid from the source 110 into the adjacent room (e.g., data center) to provide targeted cooling in the room. The vents 65 may be static (always open) or adjustable (e.g., between open and closed). In embodiments, the movement of the partitions 45 to the retracted or extended positions may be controlled by a controller 120 (such as, for example, a computing device described in greater detail below) that transmits control signals to actuators associated with each partition 45. In further embodiments the vents 65 are adjustable and may be controlled by the controller 120 transmitting control signals to actuators associated with each vent 65.

FIG. 4 shows a second exemplary mode of operation in which the cooling requirements of the room have changed. Whereas cooling is required in the vicinity of locations LB and LC in the first mode (FIG. 3), cooling is required in the vicinity of locations LB, LD, and LE in the second mode (FIG. 4). Such a change in cooling requirements may be caused, for example, by IT equipment in different areas of the room turning on and off.

Accordingly, in the second mode, the controller 120 sends actuation signals to appropriate ones of the partitions 45 to move appropriate ones of the partitions 45 to either the extended or retracted state to create second duct 70. In this manner, fluid (e.g., cool air) is provided from source 110 to locations LB, LD, and LE via second duct 70 and vents 65 located along second duct 70.

As can be seen from this example, implementations of the invention provide targeted climate control (e.g., cooling) that is quickly and easily adjusted to meet the changing needs of a data center. The invention is not limited to the two modes of operation described in FIGS. 3 and 4, but rather any suitable duct or combination of ducts may be created by moving appropriate ones of the partitions into the extended or retracted positions. Moreover, although the arrangement of first and second structural elements 10, 15 is shown to be square (e.g., six by six) any desired geometry can be used.

Furthermore, vents 65 are not limited to the locations shown in FIGS. 3 and 4. Instead, any number of vents 65 can be located at any desired locations in at least one of the first and second structural elements 10, 15.

Figure 5:
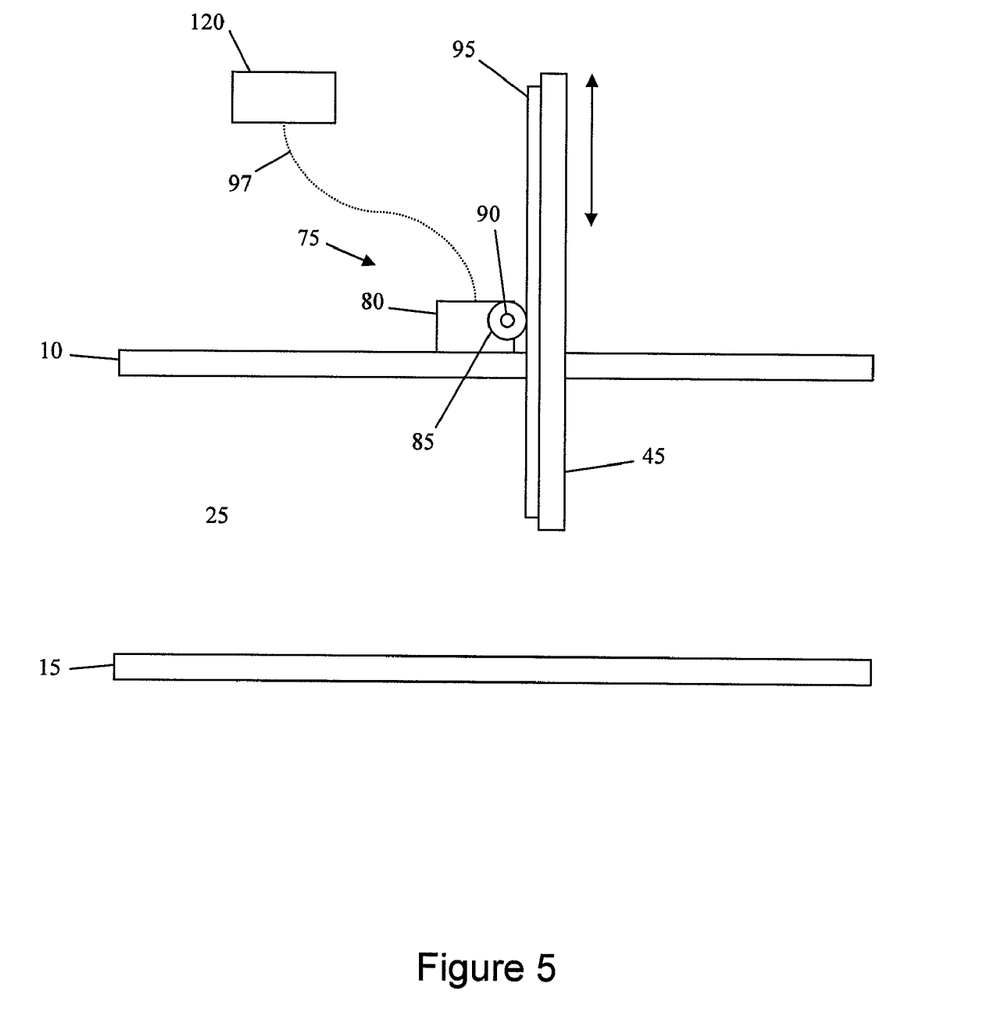
FIGS. 5 and 6 show actuation arrangements according to aspects of the invention.

In embodiments of the invention, each partition 45 is associated with an actuator for moving the partition 45 between the retracted and extended position. FIG. 5 shows an exemplary arrangement for moving vertically moveable partitions (e.g., as shown in FIGS. 1 and 2), in which an actuator 75 comprises an electric servo motor 80 with a pinion gear 85 attached to a rotatable shaft 90. The pinion gear 85 may operatively engage a rack gear 95 affixed to the partition 45, such that rotation of the servo motor drive shaft 90 causes up or down movement of the partition 45. Alternatively, the vertical motion of the partition may be provided by a servo motor operatively connected to the partition by a scissor-lift linkage mechanism (not shown) or equivalents thereof. In either case, the actuator (e.g., electric servo motor) may receive power from any suitable power source and may receive signals from controller 120 in any suitable manner (e.g., via electrical connection 97).

Figure 6:
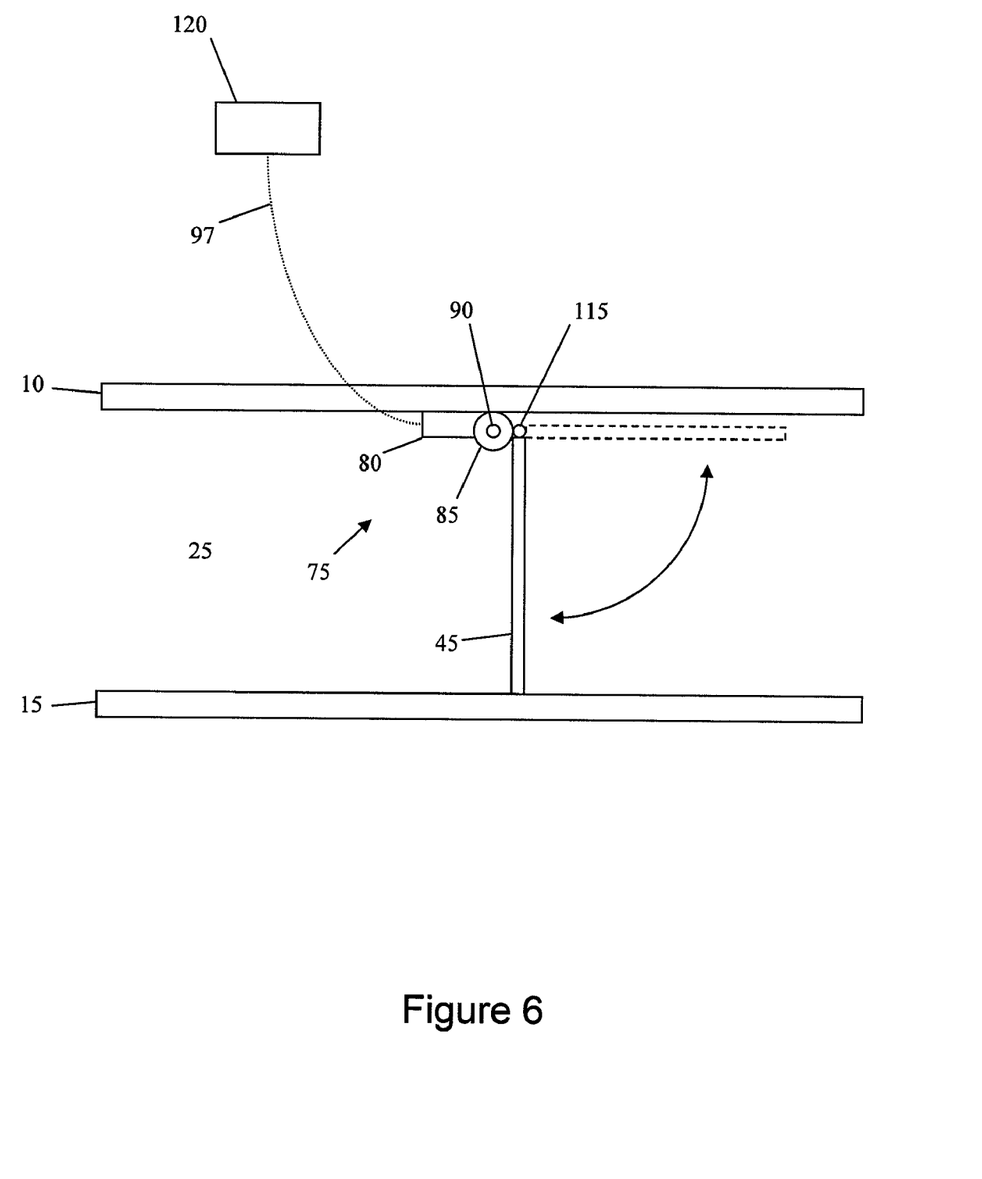

Alternatively, as depicted in FIG. 6, each partition 45 may be hingedly connected to the first structural element 10, such that the partition 45 is pivoted between the extended position and the retracted position. In this embodiment, the retracted position (shown in dashed line) is where the partition 45 is pivoted upward to lie near or against the first structural element 10, such that the partition 45 does not provide any substantial flow diversion in the space 25 between the first and second structural elements 10, 15. The actuator 75, in this case, may comprise an electric servo motor 80 having a gear 85 attached to a rotatable shaft 90. The gear 85 may operatively engage another gear 115 on a hinge axis of the partition 45, such that rotation of the servo motor drive shaft 90 causes pivoting of the partition 45.

In the embodiment shown in FIG. 6, the partition 45 may additionally be hinged (e.g., via suitable linkages, not shown) about a second axis that is generally orthogonal to the first and second structural elements 10, 15 and the hinge axis of gear 115. In this manner, the partition 45 may be moved from the retracted to the extended position (e.g., as shown in FIG. 6), and then rotated 90° about the second axis. In this manner, a single partition 45 may be moved to plural different extended positions.

Additionally or alternatively, in the embodiment shown in FIG. 6, each of the partitions 45 associated with a particular grid area GA may be arranged to substantially overlap each other (e.g., lie one on top of the other in the center of the grid area GA) when all the partitions 45 of that grid area GA are in the retracted position. By keeping track of the position of each partition 45 (e.g., retracted or extended), and by appropriately moving each respective partition 45 between its retracted and extended position, a controller can selectively create any desired pattern of extended/retracted partitions 45 of the grid area GA.

The invention is not limited to actuation arrangements described above with respect to FIGS. 5 and 6. Instead any suitable configuration of partition and actuator may be used. For example, each partition 45 may comprise a plurality of hinged segments (e.g., similar to a garage door), in which the actuator causes the partition 45 to move (e.g., glide or roll) along tracks in the space 25 between the first and second structural elements 10, 15.

The controller 120 described above may be any suitable control device, such as a computing device, that is capable of transmitting actuation signals to each one of the respective actuators of the partitions 45. The controller 120 may include a CPU, memory, storage, etc., known to those of skill in the art. In embodiments, each respective actuator 75 may be assigned a unique identifier (ID), such that individual control of each actuator 75 is possible. More specifically, each actuator 75 may be: provided with a predefined ID (e.g., similar to a MAC address); assigned an ID (e.g., similar to a static IP address) by a user via programming of the controller 120; or, automatically assigned an ID by the controller (e.g., similar to a plug-and-play dynamic IP address) by way of programming of the controller 120. By having a unique ID associated with each actuator 75, the controller 120 can be programmed to send appropriate actuation signals to each individual actuator 75 (e.g., via electrical connections and/or wirelessly) to achieve substantially any desired configuration of extended and retracted partitions 45, to therefore create any desired duct between the first and second structural elements 10, 15.

Figure 7:
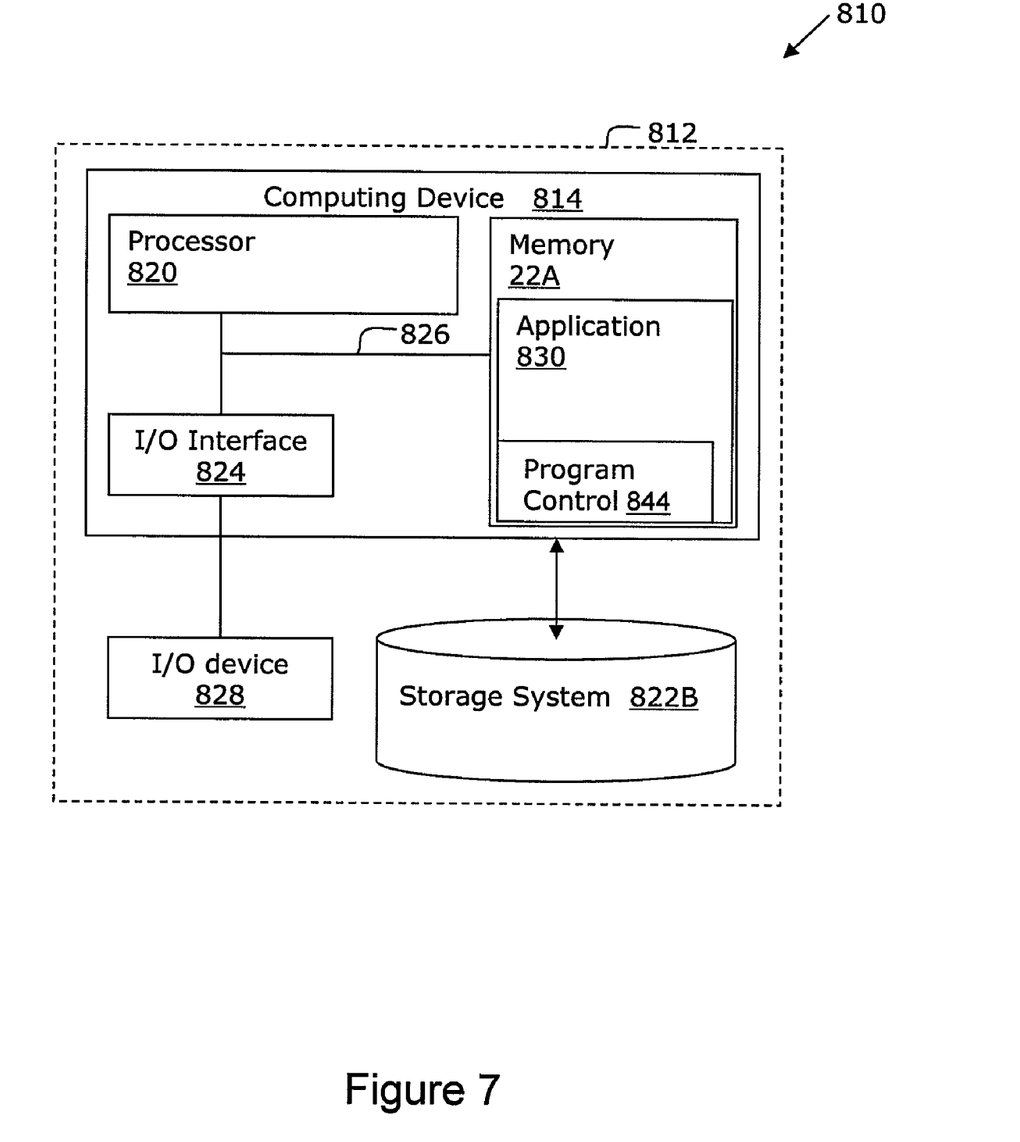
FIG. 7 shows an illustrative environment for implementing the steps in accordance with the invention.

FIG. 7 shows an illustrative environment 810 for managing processes in accordance with the invention. To this extent, the environment 810 includes a computer infrastructure 812 that can perform the processes described herein. For example, the controller 120 (described above) may comprise or be comprised within the computer infrastructure 812. In particular, the computer infrastructure 812 includes a computing device 814 that comprises an application 830 having a program control 844, which makes the computing device 814 operable to perform the processes described herein, such as, for example, providing control signals to actuators of partitions to create a dynamic duct with which to control temperature in a room sensed by sensors and/or according to a predefined cooling plan.

The computing device 814 includes a processor 820, a memory 822A, an input/output (I/O) interface 824, and a bus 826. The memory 822A can include local memory employed during actual execution of program code, bulk storage, and cache memories which provide temporary storage of at least some program code (e.g., program control 844) in order to reduce the number of times code must be retrieved from bulk storage during execution. Further, the computing device 814 is in communication with an external I/O device/resource 828 and a storage system 822B. The I/O device 828 can comprise any device that enables an individual to interact with the computing device 814 or any device that enables the computing device 814 to communicate with one or more other computing devices using any type of communications link. The external I/O device/resource 828 may be keyboards, displays, pointing devices, etc., which enable a user to adjustably control the climate in a room (e.g., data center) using dynamic ducts.

The processor 820 executes computer program code (e.g., program control 844), which is stored in memory 822A and/or storage system 822B. While executing computer program code, the processor 820 can read and/or write data to/from memory 822A, storage system 822B, and/or I/O interface 824. The bus 826 provides a communications link between each of the components in the computing device 814.

The computing device 814 can comprise any general purpose computing article of manufacture capable of executing computer program code installed thereon (e.g., a personal computer, server, wireless notebook, smart phone, personal digital assistant, etc.). However, it is understood that the computing device 814 is only representative of various possible equivalent computing devices that may perform the processes described herein. To this extent, in embodiments, the functionality provided by the computing device 814 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 812 is only illustrative of various types of computer infrastructures for implementing the invention. For example, in embodiments, the computer infrastructure 812 comprises two or more computing devices (e.g., a server cluster) that communicate over any type of communications link, such as a network, a shared memory, or the like, to perform the processes described herein. Further, while performing the processes described herein, one or more computing devices in the computer infrastructure 812 can communicate with one or more other computing devices external to computer infrastructure 812 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The steps of the flow diagram described herein may be implemented in the environments of FIGS. 1-6 and implemented in the computer infrastructure of FIG. 7. The flow diagram may equally represent a high-level block diagram of the invention. The steps of the flow diagram may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environments of FIGS. 1-6. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Figure 8:
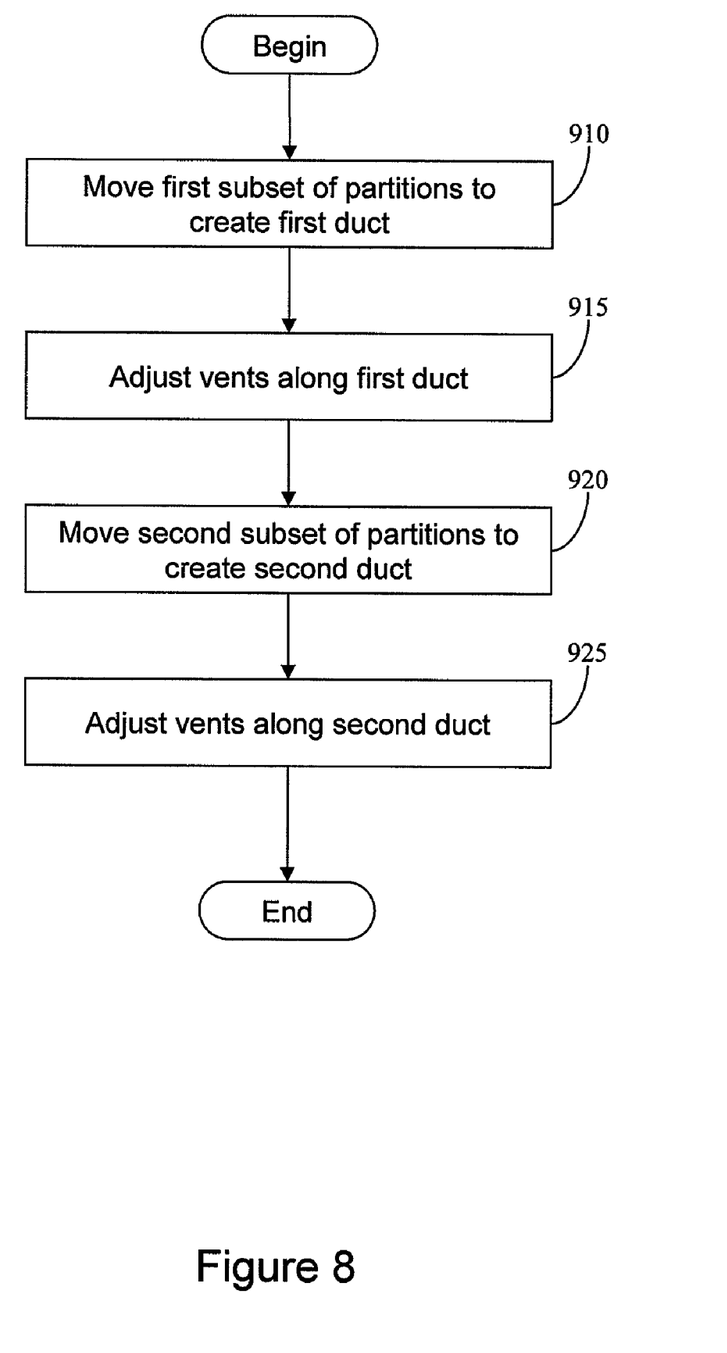
FIG. 8 shows a flow diagram depicting implementations of a method according to aspects of the invention.

FIG. 8 shows a flow diagram depicting steps of a method for providing air to a room in accordance with aspects of the invention. At step 910, a controller causes a first subset of a plurality of partitions to move into an extended position between first and second structural elements. This may be accomplished, for example, as described above with respect to FIGS. 1-6. More specifically, the controller may transmit actuation signals to appropriate ones of actuators associated with respective partitions to move the partitions to the desired position (e.g., extended or retracted) to create a first duct (e.g., first flow path) within a space between the first and second structural members. In this manner, fluid (e.g., cooling or heating air) can be provided to targeted areas of a room (e.g., data center) according to sensed temperatures in the room and/or according to a predefined heating/cooling plan.

Optionally, at step 915, the controller causes adjustable vents along the first duct to open or close. This may be accomplished, for example, by the controller sending actuation signals to appropriate ones of actuators associated with the vents located along the first duct. In this manner, selective ones of the vents along the first duct can be opened or closed as desired.

At step 920, the controller causes a second subset of the plurality of partitions to move into an extended position between the first and second structural elements. This may be accomplished, for example, as described above with respect to FIGS. 1-6. More specifically, the controller may transmit actuation signals to appropriate ones of actuators associated with respective partitions to move the partitions to the desired position (e.g., extended or retracted) to create a second duct (e.g., second flow path) within the space between the first and second structural members. In this manner, fluid (e.g., cooling or heating air) can be provided to targeted other areas of a room (e.g., data center) according to sensed temperatures in the room and/or according to a predefined heating/cooling plan.

Optionally, at step 925, the controller causes adjustable vents along the second duct to open or close. This may be accomplished, for example, by the controller sending actuation signals to appropriate ones of actuators associated with the vents located along the second duct. In this manner, selective ones of the vents along the second duct can be opened or closed as desired.

In embodiments, the room comprises a data center, the localized area comprises a hot spot, and the fluid comprises cold air for cooling the localized area. Moreover, the second duct may be different than the first duct. However, the invention is not limited to use with data centers, but rather can be used to provide localized fluid flow (e.g., air flow) into any desired area. For example, implementations of the invention could be used to provide localized air conditioning and/or heating to residential homes, conference centers, hotels, office buildings, stables, etc.

In embodiments, the invention provides a business method that performs the steps of the invention on a subscription, advertising, and/or fee basis. That is, a service provider, such as a Solution Integrator or providing entity, could offer to perform the processes described herein. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims if applicable are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A system for dynamically routing airflow, comprising:
    a first structural element;
    a second structural element spaced apart from the first structural element to define a space between the first and second structural elements;
    a plurality of partitions moveable into the space between the first and second structural elements; and
    a controller arranged to control movement of the plurality of partitions;
    wherein each of the plurality of partitions is moveable between a retracted position and an extended position;
    the retracted position is pivoted from the extended position to lie near or against the first structural element;
    at least one of the first structural element and the second structural element is divided into a grid comprising a plurality of grid areas; and
    a respective one of the plurality of partitions is associated with each respective intersection between adjacent faces of the plurality of grid areas such that in the extended position the respective one of the plurality of partitions is an only partition between the adjacent faces of the plurality of grid areas,
    a group of the plurality of partitions are arranged with a grid area; and
    the group of the plurality of partitions overlap each other in a center of the grid area when all of the group of the plurality of partitions are in the retracted position.

2. The system of claim 1, wherein in the extended position a respective one of the plurality of partitions spans substantially an entire distance between the first and second structural elements.

3. The system of claim 1, wherein in the extended position a respective one of the plurality of partitions creates a flow diversion between the first and second structural elements.

4. The system of claim 1, wherein the controller is structured and arranged to:
    move a first subset of the plurality of partitions to the extended position to create a first duct between the first and second structural members; and
    move a second subset of the plurality of partitions to the extended position to create a second duct between the first and second structural members.

5. The system of claim 4, wherein the first duct is different than the second duct.

6. The system of claim 4, wherein:
    at least one of the first and second structural members comprises a wall, ceiling, or floor of a room, and
    the first and second ducts deliver ventilation air to first and second localized areas of the room.

7. The system of claim 6, wherein the room comprises a data center.

8. The system of claim 1, further comprising a respective actuator associated with each of the plurality of partitions for causing movement between the extended and retracted positions.

9. The system of claim 1, further comprising at least one vent disposed in at least one of the first and second structural members.

10. The system of claim 9, wherein the controller is arranged to control an operating state of the at least one vent.

11. The system of claim 1, wherein:
    a respective one of the plurality of partitions pivots about a hinge axis when moving between the extended and retracted positions.

* * * * *